(12) United States Patent
Liao et al.

(10) Patent No.: US 8,322,017 B2
(45) Date of Patent: Dec. 4, 2012

(54) COVERLAY PROCESSING SYSTEM

(75) Inventors: Kai Liao, Shenzhen (CN); Ching-Hung Pi, Taoyuan (CN); Cheng-Ta Tu, Taoyuan (TW)

(73) Assignees: FuKui Precision Component (Shenzhen) Co., Ltd., Shenzhen, Guangdong Province (CN); Zhen Ding Technology Co., Ltd., Tayuan, Taoyuan (TW)

( * ) Notice: Subject to any disclaimer, the term of this patent is extended or adjusted under 35 U.S.C. 154(b) by 1383 days.

(21) Appl. No.: 11/961,241

(22) Filed: Dec. 20, 2007

(65) Prior Publication Data

US 2008/0314719 A1  Dec. 25, 2008

(30) Foreign Application Priority Data

Jun. 22, 2007 (CN) .......................... 2007 1 0076205

(51) Int. Cl.
*B23P 23/00* (2006.01)
*B65H 7/14* (2006.01)

(52) U.S. Cl. ............. 29/564; 29/26 A; 226/24; 226/150; 226/162; 414/14; 414/20; 198/464.4; 198/468.2

(58) Field of Classification Search .................. 226/10, 226/24, 45, 8, 115, 144–146, 149, 150, 162; 414/14, 20; 198/464.1, 468.9, 468.11, 464.4; 29/33 S, 33 Q, 564, 26 R, 26 A; 83/206, 83/277

See application file for complete search history.

(56) References Cited

U.S. PATENT DOCUMENTS

| | | | | |
|---|---|---|---|---|
| 3,425,687 | A | * | 2/1969 | Williams ................. 271/265.01 |
| 5,354,153 | A | * | 10/1994 | Ottone et al. ................. 408/1 R |
| 2002/0103066 | A1* | | 8/2002 | Ostrovsky ..................... 493/287 |
| 2004/0194528 | A1* | | 10/2004 | Biederman et al. ............. 72/404 |
| 2005/0229754 | A1* | | 10/2005 | Nicaise ............................ 82/127 |
| 2010/0083721 | A1* | | 4/2010 | Kern et al. ....................... 72/166 |

FOREIGN PATENT DOCUMENTS

| | | |
|---|---|---|
| TW | 505565 | 10/2002 |
| TW | 200305010 A | 10/2003 |

* cited by examiner

*Primary Examiner* — Erica E Cadugan
(74) *Attorney, Agent, or Firm* — Altis Law Group, Inc.

(57) ABSTRACT

A coverlay processing system includes a processing device and a conveyance device. The conveyance device is configured for moving the coverlay to the process device. The conveyance device includes a pulling member, a first securing member, a detector and a controller. The pulling member is configured for driving the coverlay. The first securing member is configured for stopping moving the coverlay. The detector is configured for detecting a moving state of the coverlay and is connected to the controller. The controller is connected to the processing device for managing the operation of the processing device.

15 Claims, 4 Drawing Sheets

COVERLAY PROCESSING SYSTEM

BACKGROUND OF THE INVENTION

1. Field of the Invention

The present invention relates to devices for manufacturing printed circuit boards and, particularly, to a coverlay processing system for a printed circuit board.

2. Description of Related Art

With the development of science and technology, integrated circuits, such as portable devices and the like, require ever greater degrees of miniaturization and weight reduction. To meet these requirements, the degree of circuit integration is increasing. As part of the increase in circuit density, the width of traces, gaps between traces, and the diameter of via are becoming smaller. To accommodate these developments, flexible printed circuit boards have been developed.

A typical flexible printed circuit board includes a base film and a copper film disposed on a surface of the base film. Conductive traces are disposed on the copper film. A coverlay is arranged on the conductive traces for protecting the conductive traces against damages. In order to accommodate structures and sizes of the flexible printed circuit board, the coverlay is cut/sheared by a cutting machine using a roll-to-roll process. Referring to FIG. 4, a coverlay is moved by a conveyance device 30 to a cutting machine 20. The coverlay includes a first segment 11 adjacent to the cutting machine 20, a second segment 12 adjacent to the conveyance device 30. In the process of transmitting the coverlay, once the first segment 11 reaches a location adjacent to the cutting machine 20, the first segment 11 will freewheel to the cutting machine 20. The second segment 12 is driven by the conveyance device 30 to move towards the cutting machine 20. A moving speed of the first segment 11 is less than that of the second segment 12. As a result, an arched segment 13 may be formed between the first segment 11 and the second segment 12. At the moment, the cutting machine 20 continues to cut the coverlay according to the original speed, thus the arched segment 13 of the coverlay may be cut improperly.

Therefore, a coverlay process system, which can avoid the improper cutting, is desired.

SUMMARY OF THE INVENTION

An embodiment of a coverlay processing system includes a processing device and a conveyance device. The conveyance device is configured for transmitting the coverlay to the processing device. The conveyance device includes a pulling member, a first securing member, a detector and a controller. The pulling member is configured for driving the coverlay. The first securing member is configured for stopping the transmitting process of the coverlay. The detector is configured for detecting a moving state of the coverlay and is connected to the controller. The controller is connected to the processing device for managing the operation of the processing device.

Advantages and novel features will become more apparent from the following detailed description when taken in conjunction with the accompanying drawings.

BRIEF DESCRIPTION OF THE DRAWINGS

Many aspects of the present coverlay processing system can be better understood with reference to the following drawings. The components in the drawings are not necessarily drawn to scale, the emphasis instead being placed upon clearly illustrating the principles of the present coverlay processing system. Moreover, in the drawings, like reference numerals designate corresponding parts throughout the several views.

DETAILED DESCRIPTION OF THE INVENTION

Embodiments will now be described, in detail, below and with reference to the drawings.

Figure 1:
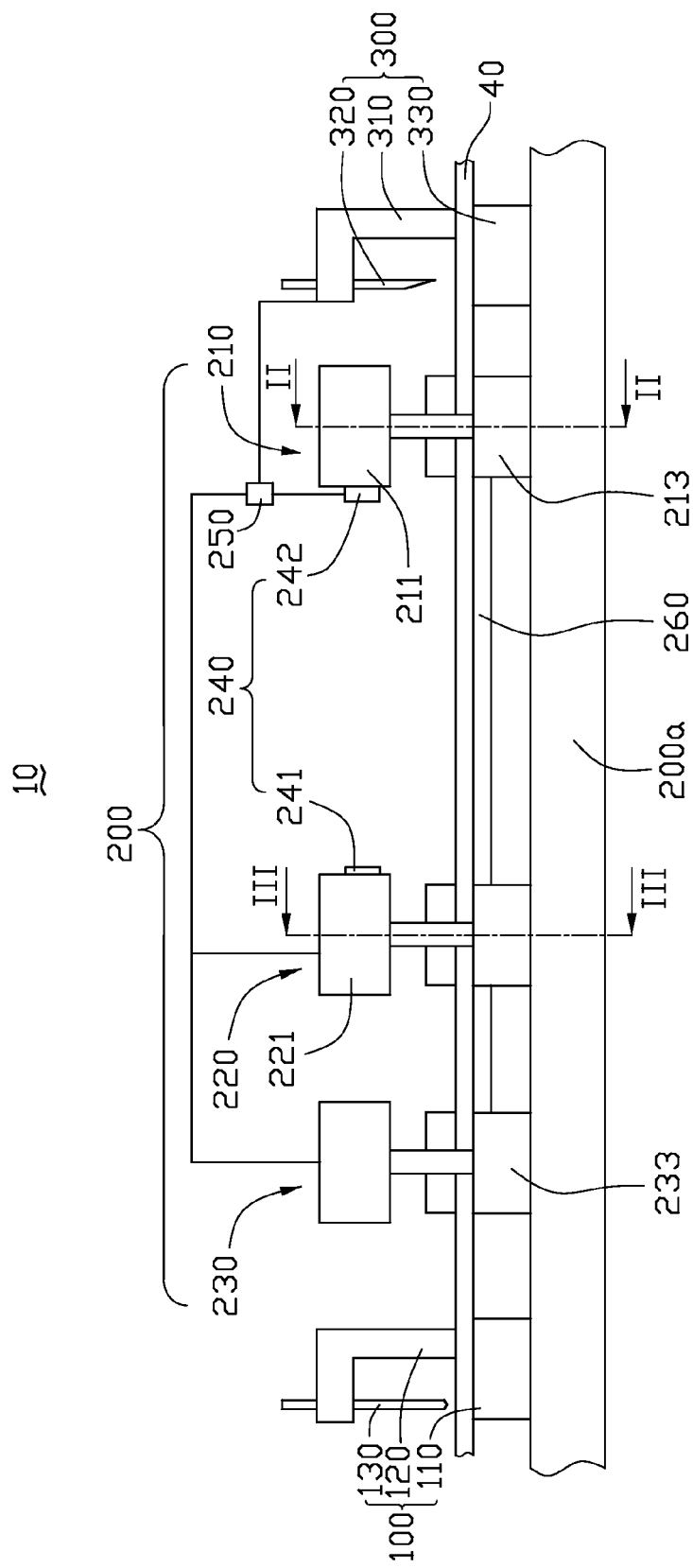
FIG. 1 is a schematic, isometric view of a coverlay process system, in accordance with a present embodiment.

Referring to FIG. 1, an embodiment of a coverlay processing system 10 is shown. A strip-shaped coverlay 40 is provided to be processed by the coverlay processing system 10. The coverlay processing system 10 includes a drilling device 100, a conveyance device 200, and a cutting machine 300. The drilling device 100, the conveyance device 200, and the cutting machine 300 are arranged in that order. In the present coverlay processing system 10, the drilling device 100 and the cutting machine 300 only represent two processing devices. For example, the drilling device 100 and the cutting machine 300 can be replaced by other processing devices (e.g., a laminating device alone or in combination with the drilling device 100 and the cutting machine 300).

The drilling device 100 is configured for drilling holes in the coverlay 40, in order to accommodate the requirements of the flexible printed circuit to be covered. The flexible printed circuit board includes a base film, a number of conductive traces (not shown), and a number of welding pads (not shown). The conductive traces and welding pads are formed on a surface of the base film. The welding pads are configured for mounting electronic device on the flexible printed circuit board. When the coverlay 40 covers the conductive traces, the welding pads are exposed so as to engage with the electronic device. Therefore, a number of through holes corresponding to the welding pads should be formed in the coverlay 40 before the coverlay 40 is laid on the flexible printed circuit.

The through holes corresponding to the welding pads can be formed in the coverlay 40 before or after the coverlay 40 being processed by the cutting machine 300. For example, the through holes are formed in the coverlay 40 by chemical etching method, thus the coverlay processing system 10 can exclude the drilling device 100. In the present embodiment, in order to continuously manufacturing a number of coverlays 40 with appropriate shapes and sizes corresponding to the given flexible printed circuits, the drilling device 100 is incorporated into the coverlay processing system 10.

The drilling device 100 includes a worktable 110, a cantilever 120, and a drilling element 130. The cantilever 120 is fixed on the worktable 110. The drilling element 130 is movably installed on the cantilever 120 and is perpendicular to the worktable 110. The distance between the drilling element 130 and the worktable 110 can be adjusted by moving the drilling element 130. The drilling element 130 can be a mechanical drill or a laser drill. It is to be understood that the drilling device 100 can includes a number of drilling elements 130 to drill a number of through holes in the coverlay 40 all at once.

The conveyance device 200 includes a first securing member 210, a pulling member 220, a detector 240, and a controller 250. The pulling member 220 and the first securing member 210 are arranged in that order. The pulling member 220 (e.g., a transmission belt) is provided to 7 move the coverlay 40. The first securing member 210 is arranged adjacent to the cutting machine 300 to stop moving the coverlay 40 from the pulling member 220 to the cutting machine 300. The detector 240 is used to detect whether or not the coverlay 40, between the pulling member 220 and the cutting machine 300, is kinked. Simultaneously, the detector 240 transmits a signal of the detected result to the controller 250 and the controller 250 manages the operation of the first securing member 210.

Advantageously, the conveyance device 200 additionally includes a second securing member 230 assisting the first securing member 210 to stop the process of moving the coverlay 40. The second securing member 230, the pulling member 220 and the first securing member 210 are arranged in that order. The controller 250 can also be separately connected to the pulling member 220 and the second securing member 230 to separately manage the operation of the pulling member 220 and the second securing member 230. The detector 240 detects the moving state of the coverlay 40 and transmits a signal of the detected result to the controller 250. According to the detected result (i.e., the moving state) of the coverlay 40, the controller 250 manages the respective operation of the pulling member 220, the first securing member 210, and the second securing member 230. When the coverlay 40 between the pulling member 220 and the cutting machine 300 is kinked/arched, the first securing member 210 alone or in combination with the second securing member 230 stops moving the coverlay 40 to the cutting machine 300, and the cutting machine 300 is stopped simultaneously.

Figure 2:
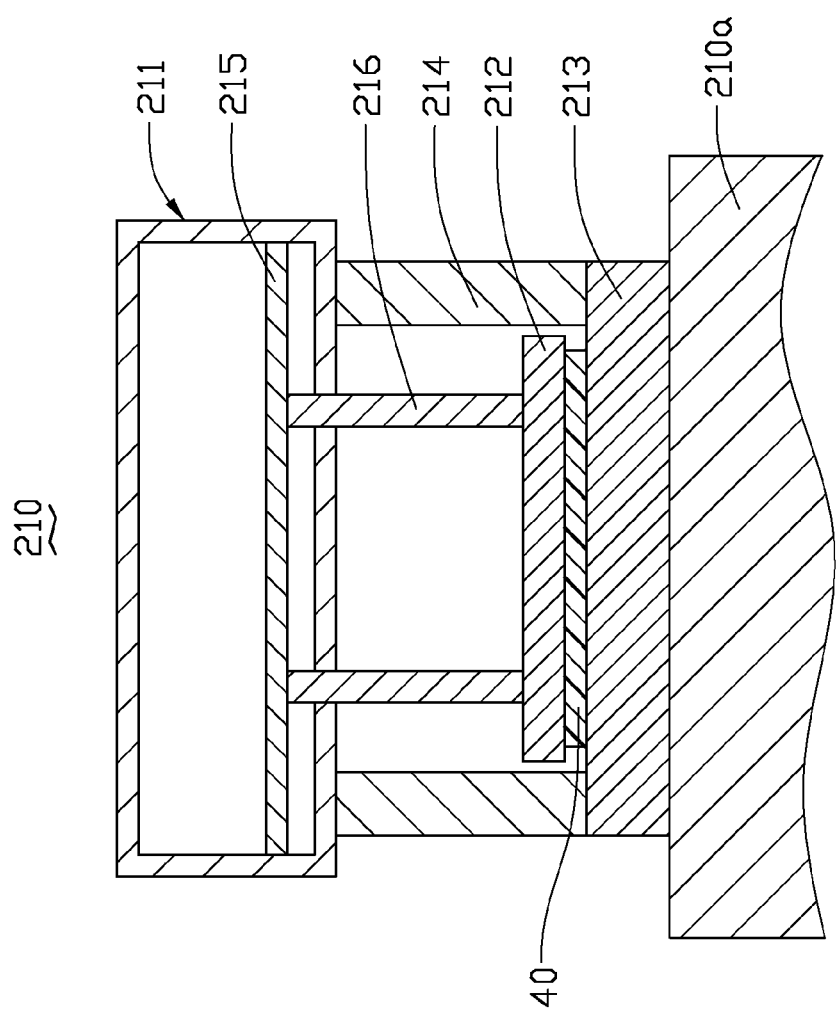
FIG. 2 is a schematic, sectional view along line II-II of FIG. 1, showing a securing member of the coverlay process system of FIG. 1.

Referring to FIG. 2, the first securing member 210 includes a base 210a, a gas chamber 211 with a stopcock 215 arranged therein, a bottom plate 213 fixed on the base 210a, and a top plate 212 movably connected to the stopcock 15 by a pole 216. The gas chamber 211 is fixed on the bottom plate 213 by two supporting parts 214. The bottom plate 213 is configured for supporting the coverlay 40. The top plate 212 and the bottom plate 213 cooperate to clamp the coverlay 40 therebetween. When the process of moving the coverlay 40 needs to be stopped, the first securing member 210 stops the process of moving the coverlay 40. In detail, the stopcock 215 pushed by the pressurized gas in the gas chamber 211 drives the top plate 212 to move towards the bottom plate 213. Thus, a distance between the top plate 212 and the bottom plate 213 can be reduced, until the coverlay 40 can be clamped, thereby the process of moving the coverlay 40 being stopped. When the coverlay 40 needs to be moved continuously, the coverlay 40 clamped by the first securing member 210 can be relaxed.

The second securing member 230 has an identical structure with the first securing member 210. The second securing member 230 has an identical operation manner with the first securing member 210. Thus, the first securing member 210 and the second securing member 230 cooperate to stop the moving of the coverlay 40. It is to be understood that, the number of the securing member is not limited, so long as the securing member can stop the moving process of the coverlay 40. For example, the conveyance device 200 does not include the second securing member 230.

Figure 3:
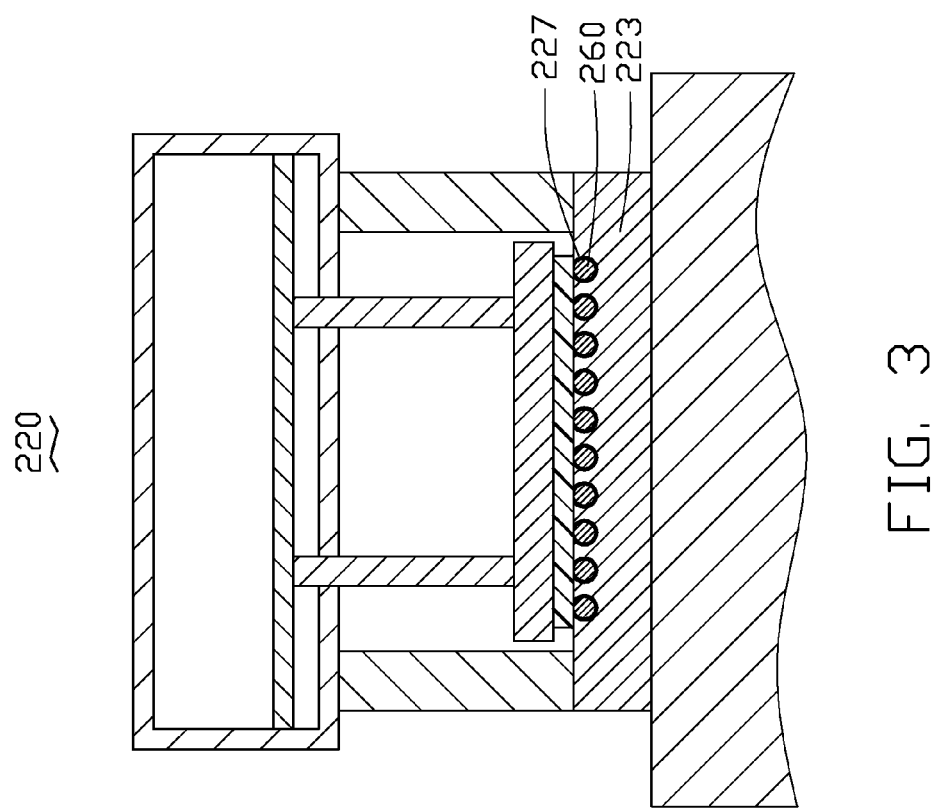
FIG. 3 is a schematic, sectional view along line III-III of FIG. 1, showing a pulling member of the coverlay process system of FIG. 1.
Figure 4:
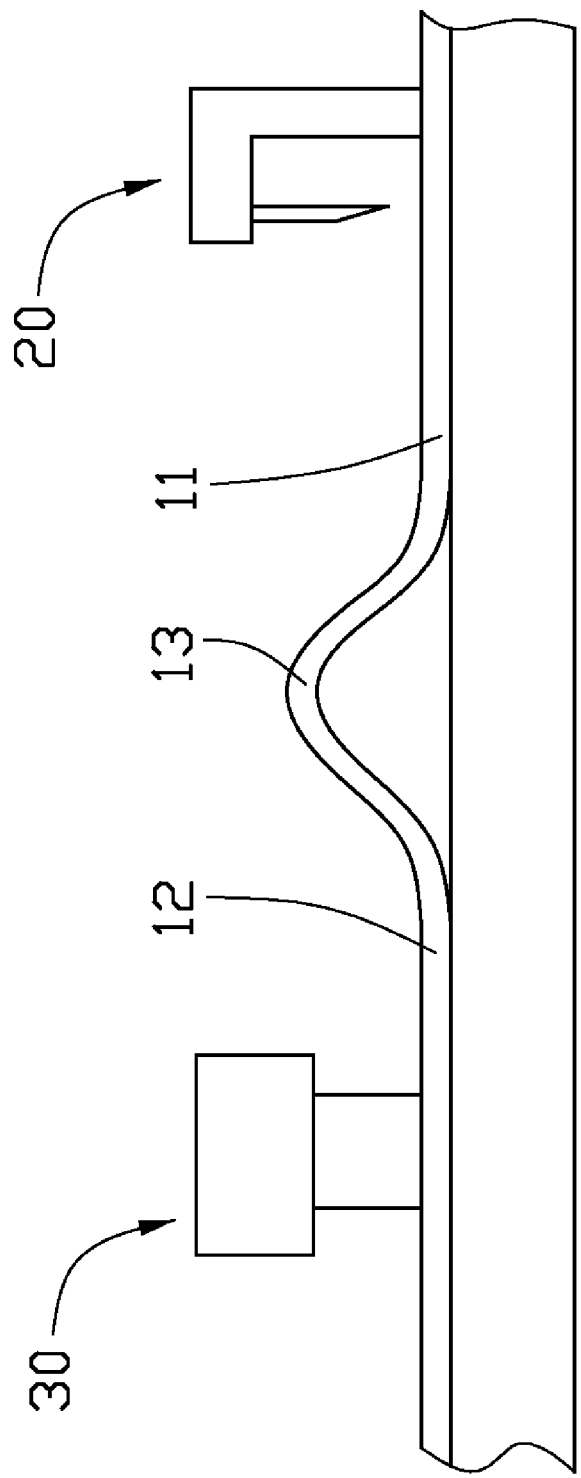
FIG. 4 is schematic view of a coverlay process system, in accordance with a related art.

Referring to FIG. 3, the pulling member 220 has a similar structure with the first securing member 210, except that a bottom plate 223 of the pulling member 220 includes a number of through holes 227. The through holes 227 are configured for receiving a number of connection poles 260 therein. One end of each of the connection poles 260 is received in the through hole 227 of the pulling member 220, another end is connected to the bottom plate 213 of the first securing member 210. In such fashion, the first securing member 210, the pulling member 220 and the second securing member 230 can be connected by the connection poles 260. Therefore, the coverlay 40 can be moved among the first securing member 210, the pulling member 220 and the second securing member 230 continuously. It is to be understood that any potential variance in connection (e.g., providing a tape-shaped plate for interconnecting the first securing member 210, the pulling member 220 and the second securing member 230), the first securing member 210, the pulling member 220 and the second securing member 230 is considered to be within the scope of the present conveyance device 200, so long as they can ensure the coverlay 40 can be moved continuously.

The detector 240 includes an emitter 241 and an oppositely-arranged accepter 242. The emitter 241 is mounted on the pulling member 220, and the accepter 242 is mounted on the first securing member 210. The emitter 241 and the accepter 242 are positioned on same side of the coverlay 40 to be transmitted, and the emitter 241 and the accepter 242 are located at an identical horizontal height (i.e., a distance between the emitter 241 and the coverlay 40 to be transmitted is equal to a distance between the accepter 242 and the coverlay 40 to be transmitted). The emitter 241 and the accepter 242 cooperate to detect whether or not the coverlay 40 transmitted between the pulling member 220 and the first securing member 210 is arched. In a working state of the detector 240, the emitter 241 emits light beam to the accepter 242 and the accepter 242 receives the light beam from the emitter 241. During a moving process of the coverlay 40, when the coverlay 40 is kinked, the kinked portion of the coverlay 40 can interrupt the light beam from the emitter 241 to the accepter 242. When the light beam is thus interrupted, a moving state of coverlay 40 can be judged by the detector 240. It is to be understood that the detector 240 can be other instruments, or the emitter 241 and the accepter 242 can be arranged at other positions, so long as they can detect whether or not the coverlay 40 moved between the pulling member 220 and the first securing member 210 is kinked.

A process of machining the coverlay 40 by the present coverlay processing system 10 includes the following steps: First, the coverlay 40 is moved by the conveyance device 220 to the drilling device 100. A number of through holes corresponding to a number of welding pads of a given printed circuit board are formed in the coverlay 40. Second, the coverlay 40 is moved towards the cutting machine 300 continuously. During the moving process, the detector 240 detects the moving state of the coverlay 40 instantly. When the coverlay 40 is kinked during the moving process, the detector 240 will transmit the kinked signal to the controller 250. The controller 250 can manage the respective operation of the pulling member 220, the first securing member 210, the second securing member 230, and the cutting machine 300. Then the pulling member 220 can stop the process of moving the coverlay 40, and/or the first securing member 210 alone or in combination with the second securing member 230 to clamp the coverlay 40, and/or the cutting machine 300 stop cutting the coverlay 40. After the arching of the coverlay 40 has been eliminated or smooth out, the coverlay 40 is moved and the process continues.

Because the coverlay processing system 10 includes the detector 240 and the controller 250, a moving state (i.e., whether or not the coverlay 40 is kinked) of the coverlay 40 can be detected instantly, and the detected information can be messaged to the controller 250 in time. Thus, the cutting machine 300, the pulling member 220, and/or the first securing member 210 can be managed by the controller 250 timely, thereby avoids cutting machine 300 improperly cutting the coverlay 40, and/or avoids the coverlay 40 being kinked continuously.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A coverlay processing system for processing a flexible coverlay sheet, the coverlay processing system comprising:
   a processing device for machining the flexible coverlay sheet; and
   a conveyance device configured for moving the flexible coverlay sheet to the processing device, the conveyance device comprising a pulling member, a first securing member, a detector and a controller, the pulling member configured for driving the flexible coverlay sheet, the first securing member configured for stopping moving the flexible coverlay sheet, the detector comprising an emitter mounted on the pulling member and an accepter mounted on the first securing member, such that the emitter and the accepter cooperate to detect a kinked portion of the flexible coverlay sheet, and the detector being connected to the controller, and the controller being connected to the processing device, such that when the detector detects the kinked portion of the flexible coverlay sheet, the controller stops the processing device from machining the flexible coverlay sheet.

2. The coverlay processing system as claimed in claim 1, wherein the first securing member is arranged between the pulling member and the processing device, and the first securing member is arranged closer to the processing device than to the pulling member.

3. The coverlay processing system as claimed in claim 1, wherein the emitter emits a light beam to the accepter, and the kinked portion interrupts the light beam.

4. The coverlay processing system as claimed in claim 1, wherein the controller is connected to the first securing member and the pulling member.

5. The coverlay processing system as claimed in claim 1, wherein the coverlay processing system further comprises a second securing member for stopping moving the flexible coverlay sheet alone or in combination with the first securing member.

6. The coverlay processing system as claimed in claim 1, wherein the processing device comprises a cutting machine, and the coverlay processing system further comprising a drilling device; and
   the drilling device, the pulling member, the first securing member, and the cutting machine are arranged in that order.

7. The coverlay processing system as claimed in claim 1, wherein the first securing member comprises a bottom plate and a top plate movably arranged opposite to the bottom plate, and the top plate and the bottom plate cooperate to clamp the flexible coverlay sheet.

8. The coverlay processing system as claimed in claim 7, wherein the pulling member comprises a bottom plate and a top plate movably arranged opposite to the bottom plate, and the top plate and the bottom plate cooperate to clamp the flexible coverlay sheet.

9. The coverlay processing system as claimed in claim 8, wherein a plurality of through holes are defined in the bottom plate of the pulling member, and one end of each of a plurality of connection poles is received in the corresponding through hole.

10. A coverlay processing system for processing a flexible coverlay sheet, the coverlay processing system comprising:
    a cutting machine; and
    a conveyance device configured for translating the flexible coverlay sheet to the cutting machine, the conveyance device comprising a pulling member, a first securing member, a detector and a controller, the pulling member configured for driving the flexible coverlay sheet, the first securing member being arranged closer to the cutting device than to the pulling member and configured for stopping moving the flexible coverlay sheet, the detector comprising an emitter mounted on the pulling member and an accepter mounted on the first securing member, such that the emitter and the accepter cooperate to detect a kinked portion of the flexible coverlay sheet, and the detector being connected to the controller, and the controller being connected to the cutting device, such that when the detector detects the kinked portion of the flexible coverlay sheet, the controller stops the cutting device from cutting the flexible coverlay sheet.

11. The coverlay processing system as claimed in claim 10, wherein the pulling member, the first securing member and the cutting machine are arranged in that order.

12. The coverlay processing system as claimed in claim 10, wherein the emitter emits a light beam to the accepter, and the kinked portion interrupts the light beam.

13. The coverlay processing system as claimed in claim 10, wherein the controller is connected to the first securing member and the pulling member.

14. A coverlay processing system for processing a flexible coverlay sheet, the coverlay processing system comprising:
    a drilling device;
    a cutting machine; and
    a conveyance device configured for moving the flexible coverlay sheet to the cutting machine, the conveyance device comprising a pulling member, a first securing member, a detector and a controller;
    wherein the drilling device, the pulling member, the first securing member and the cutting machine are arranged in the written order and the first securing member is arranged closer to the cutting machine than to the pulling member, the pulling member configured for driving the flexible coverlay sheet, the first securing member configured for stopping moving the flexible coverlay sheet, the detector comprising an emitter mounted on the pulling member and an accepter mounted on the first securing member, such that the emitter and the accepter cooperate to detect a kinked portion of the flexible coverlay sheet, and the detector being connected to the controller, and the controller being connected to the cutting machine, such that when the detector detects the kinked portion of the flexible coverlay sheet, the controller stops the cutting machine from cutting the flexible coverlay sheet.

15. The coverlay processing system as claimed in claim 14, wherein the controller is connected to the pulling member and the first securing member.

* * * * *